(12) United States Patent
Jensen et al.

(10) Patent No.: US 8,278,904 B2
(45) Date of Patent: Oct. 2, 2012

(54) HIGH BANDWIDTH POWER SUPPLY SYSTEM WITH HIGH EFFICIENCY AND LOW DISTORTION

(75) Inventors: Brent Roger Jensen, Hillsboro, OR (US); Serge Francois Drogi, Flagstaff, AZ (US); Martin Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 581 days.

(21) Appl. No.: 12/508,505

(22) Filed: Jul. 23, 2009

(65) Prior Publication Data

US 2011/0018351 A1    Jan. 27, 2011

(51) Int. Cl.
*G05F 5/00*    (2006.01)
(52) U.S. Cl. ...................................... 323/299
(58) Field of Classification Search .................. 323/282, 323/284, 285, 299
See application file for complete search history.

(56) References Cited

U.S. PATENT DOCUMENTS

| | | | |
|---|---|---|---|
| 5,550,729 A * | 8/1996 | Wissell | 363/65 |
| 5,987,244 A | 11/1999 | Kau et al. | |
| 7,105,947 B1 * | 9/2006 | Marshall et al. | 307/28 |
| 7,498,880 B2 | 3/2009 | Delano | |
| 7,555,665 B2 * | 6/2009 | Belson et al. | 713/330 |
| 2008/0258811 A1 | 10/2008 | North | |
| 2008/0265822 A1 | 10/2008 | Menegoli et al. | |

OTHER PUBLICATIONS

PCT International Search Report and Written Opinion, PCT Application No. PCT/US10/39232, Aug. 17, 2010, 11 pages.

* cited by examiner

*Primary Examiner* — Matthew Nguyen
(74) *Attorney, Agent, or Firm* — Fenwick & West LLP

(57) ABSTRACT

A power supply system uses improved Class G amplifier architecture for high bandwidth operation with low distortion. The power supply system switches between multiple power supply rails, depending on the signal level handled by the power supply system. The lowest usable supply rail voltage is chosen to minimize power dissipation in the output driver, thus optimizing efficiency. Each supply rail has an associated driver capable of sourcing current to the amplifier output. When a supply rail is selected, its associated driver is enabled and other driver(s) not associated with the selected supply rail are disabled via separate disable control signals. The disabling of the deselected driver may be delayed until current above a predetermined threshold is sensed at the output of the enabled driver. In addition, the frequency of switching between the power rails may be limited via various means designed to limit distortion in the power supply system.

27 Claims, 14 Drawing Sheets

Class G with Dual Supply Rails
Efficiency= 59%

Single Supply Rail
Efficiency= 49%

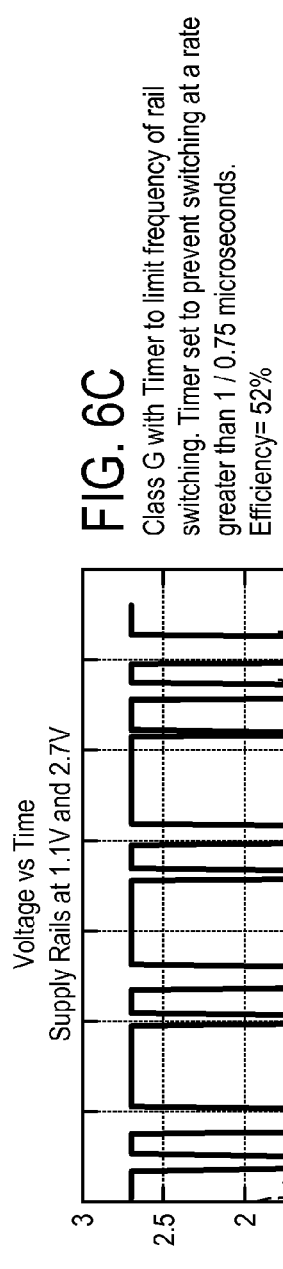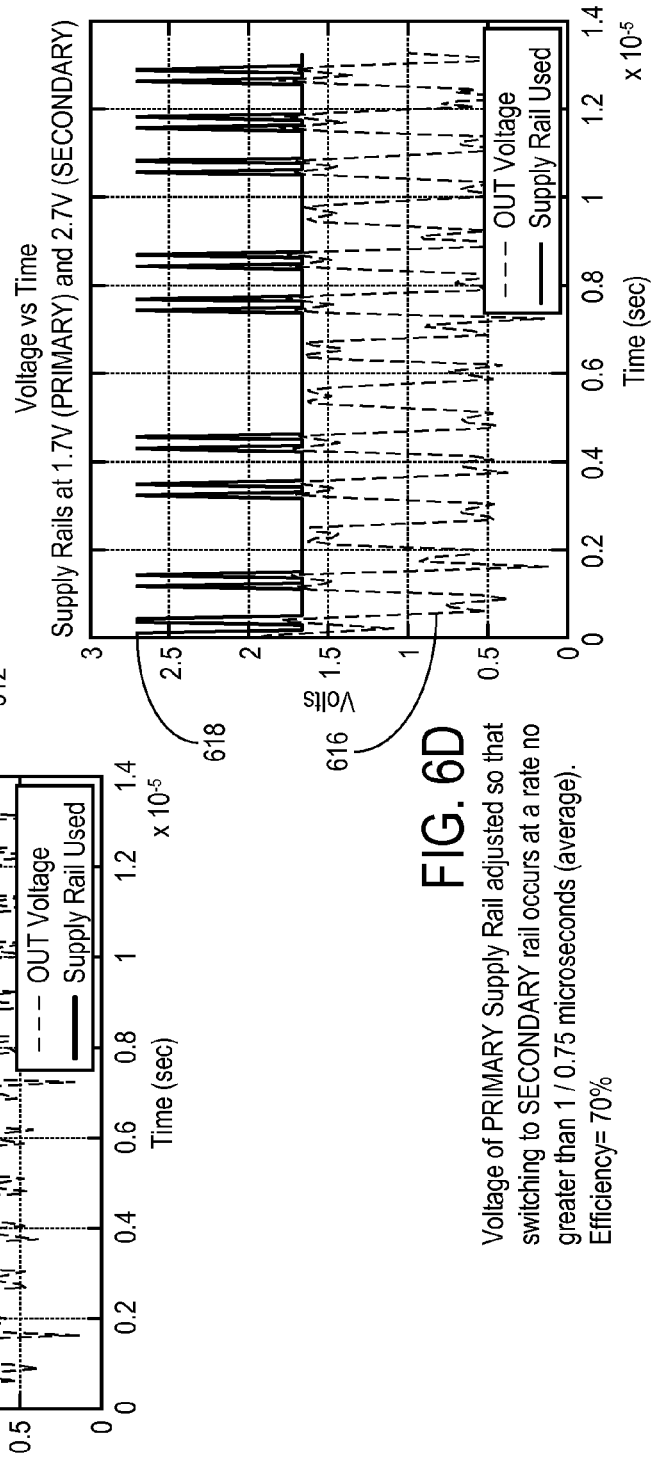

HIGH BANDWIDTH POWER SUPPLY SYSTEM WITH HIGH EFFICIENCY AND LOW DISTORTION

BACKGROUND OF THE INVENTION

1. Field of the Invention

The present invention relates to a high bandwidth, high efficiency power supply system that can be used to power an RF PA (Radio Frequency Power Amplifier).

2. Description of the Related Arts

In certain electronic systems, there is a need for a high bandwidth, high efficiency power supply. As an illustrative example, a radio system may include an ET (envelope tracking) transmitter, where the RF PA is fed by a power supply which tracks the amplitude of the RF modulation. The RF PA is therefore supplied with a varying voltage that improves efficiency. Typically, the power supply providing power to such a PA is a linear regulator with a fast response, with the output voltage of the linear regulator controlled electronically to track the amplitude modulation. However, such a linear regulator is inefficient, as linear regulators control the output voltage via a dissipative pass transistor. A more efficient alternative could be to use a switching regulator. However, these switching regulators lack the control bandwidth to modulate their output voltage at the rate needed to track the amplitude modulation in many modern radio systems.

A class G amplifier may be used to provide power to a PA. A conventional class G amplifier architecture improves the efficiency of a Class AB amplifier, by allowing the class G amplifier to switch between multiple power supply rails during operation. Typically, the lowest voltage power rail is chosen while the signal swing is low, and higher voltage rails are used when the signal swing is higher. Thus, the conventional class G amplifier is supplied by the higher voltage rails only as needed. The power efficiency of a class G amplifier is a strong function of the voltage of the supply rail, since the power equal to the difference between the voltage of the supply rails and the voltage at the amplifier output multiplied by the output current is dissipated as heat. The best efficiency is thus achieved by switching to the lowest voltage supply rail possible while maintaining sufficient headroom for proper operation of the amplifier.

FIG. 1 shows a conventional unipolar Class G amplifier. The amplifier 100 is unipolar because only positive supply voltages rails are used. Voltage supply rails V1 and V2 have associated drivers 102 and 104 capable of sourcing current to the amplifier output 112, when enabled. Voltage V1 is assumed to be lower than voltage V2. Driver 132 sinks current from the load (not shown) at the output 112 to ground. At any point in time, either driver 102 or driver 104 is selected to operate, depending on the voltage at output 112. Comparator 118 compares this output voltage 112 with a threshold voltage 122 at its negative comparator input, to select either driver 102 or driver 104 via select signals 106, 108, respectively. Inverter 125 ensures that, when one driver (102 or 104) is on, the other driver (104 or 102) is off. Threshold voltage 122 is approximately equal to voltage V1 but may be offset slightly by offset voltage 120, so that driver 104 is selected (and driver 102 is unselected) when output voltage 122 is slightly below voltage V1, to provide for some voltage headroom for driver 102. As described earlier, compared with other conventional amplifiers operating from a fixed voltage V2, the conventional Class G amplifier of FIG. 1 improves efficiency to some extent by switching to a lower voltage supply rail V1 whenever the output voltage 112 is low, thereby reducing dissipated heat.

Class G amplifiers may be used in a variety of configurations, including bipolar schemes (with positive and negative supply rail voltages), as well as in bridge amplifiers. However, Class G amplifiers are typically limited to low frequency operation (e.g. audio). This well-known limitation is due to distortion increasing in the amplifier with increasing frequency. When the Class G amplifier switches supply rails, a discontinuity in current results from the selection and deselection (enabling or disabling) of the drivers 102, 104. At low frequencies, this discontinuity is relatively short compared with the signaling periods, and thus the energy from the glitch makes a relatively low contribution. However, at higher frequencies, the glitch period becomes proportionally more substantial. For example, today's conventional Class G amplifiers used for an ET (envelope tracking) transmitter, where the RF PA is fed by a power supply which tracks the amplitude of the RF modulation, may not be suitable for many transmitter systems operating at modulation rates common in cellular systems. In cellular systems, distortion causes unwanted out-of-band spectral energy that reduces network utilization, and may exceed the limits specified in the specifications required for such systems. For example, the 3G WCDMA system utilizes a modulation symbol rate of 3.84 MSPS (megasymbols per second), at least two orders of magnitude higher frequency than audio.

SUMMARY OF THE INVENTION

Embodiments of the present invention include a power supply system using an improved Class G amplifier architecture to allow for high bandwidth operation with low distortion. The power supply system switches between multiple power supply rails, depending on the signal level handled by the power supply system. The lowest usable supply rail voltage is chosen to minimize power dissipation in the output driver, thus optimizing efficiency. Each supply rail has an associated driver capable of sourcing current to the amplifier output. When a supply rail is selected, the driver associated with the selected supply rail is enabled and other driver(s) not associated with the selected supply rail are disabled via separate disable control signals.

In one embodiment, the disabling of the deselected driver is delayed until current above a predetermined threshold is sensed at the output of the enabled driver. Thus, continuous current to the load of the power supply system is assured, and distortion is reduced.

In another embodiment, a timer is employed to limit the frequency of switching between the power rails. The timer is started when a supply rail is selected, and switching to a lower voltage supply rail is disallowed until the timer runs out. Since some distortion associated with the switching between power rails is unavoidable, limiting the frequency of switching correspondingly reduces the average distortion.

In still another embodiment, instead of a timer used to limit the frequency of switching between the power rails, the voltages of one or more power rails are adjusted. The power rails may be adjusted, so that the majority of the times the primary power rails are selected, and switching to the secondary rails occurs only occasionally. Thus, average distortion is reduced by the limited frequency of switching between the power rails.

BRIEF DESCRIPTION OF THE DRAWINGS

The teachings of the embodiments of the present invention can be readily understood by considering the following detailed description in conjunction with the accompanying drawings.

FIG. ("FIG.") 1 illustrates a conventional class G amplifier.

FIG. 6C and FIG. 6D illustrate output voltage waveforms of the power supply systems according to the second and third embodiments of FIGS. 2C and 3C, respectively.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 2A:
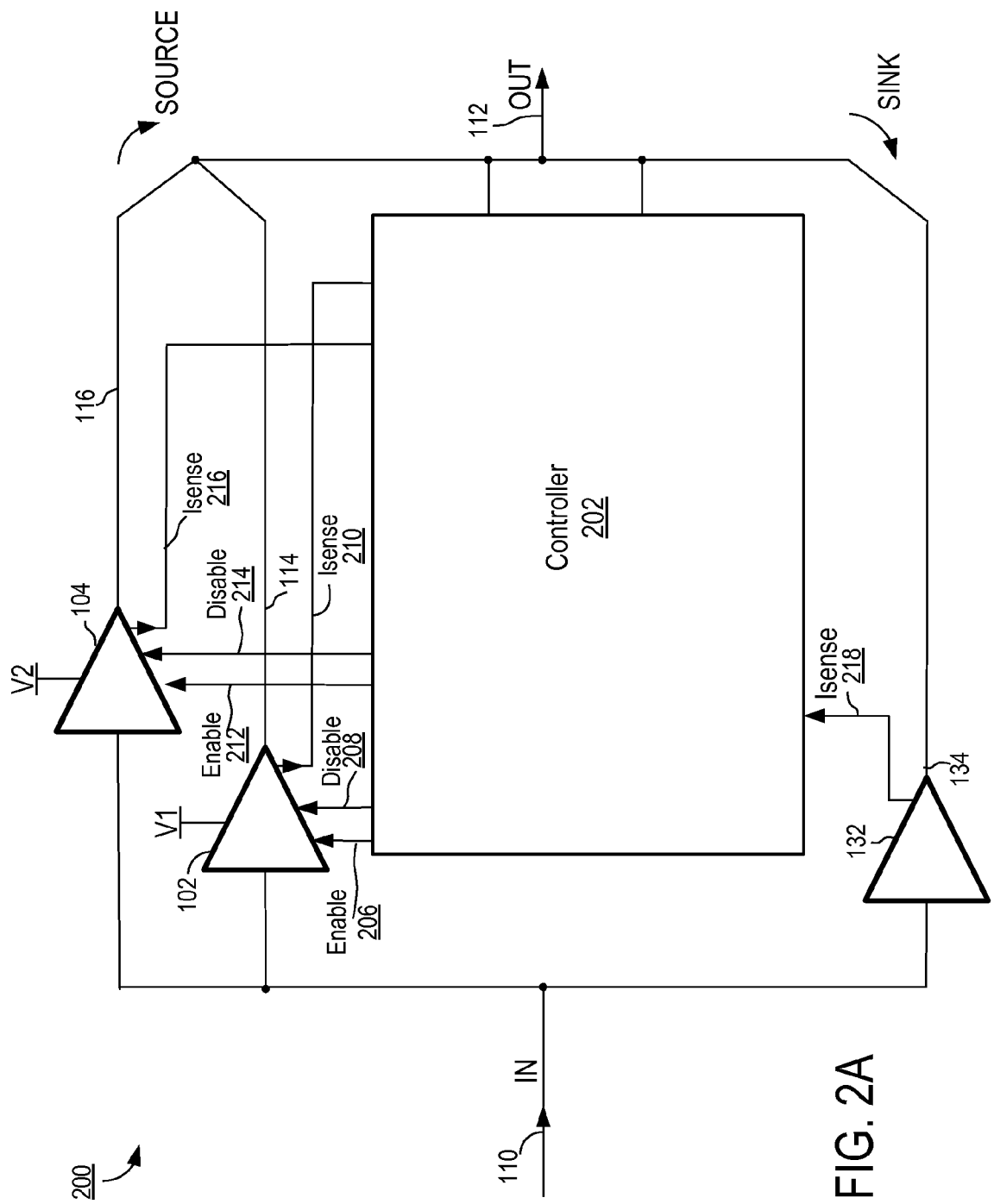
FIG. 2A illustrates a power supply system according to a first embodiment.

FIG. 2A illustrates a power supply system according to a first embodiment. The power supply system 200 of FIG. 2A uses a class G amplifier that is improved and modified to allow operation at higher frequencies while maintaining an acceptable level of distortion. Power supply system 200 includes source drivers 102, 104, a sink driver 132, and a controller 202. Power supply system 200 receives an input control signal 110 and generates a supply voltage output 112. Current sourcing drivers 102, 104 are associated with supply rails V1 and V2, respectively. Controller 202 includes the capability to independently enable current sourcing drivers 102 and 104 via enable signals 206, 212, respectively, and to independently disable current sourcing drivers 102 and 104 via disable signals 208, 214, respectively. The enable signals 206, 212 and disable signals 208, 214 may be edge triggered. As well, controller 202 senses current from the current source drivers 102, 104 via Isense signal lines 210, 216, respectively, and also senses current from the current sink driver 134 via Isense signal line 218. Such current of the current source drivers 102, 104 may be sensed by current mirroring transistors (not shown in FIG. 2A) associated with the main driver output current transistors used within the drivers.

Figure 1:
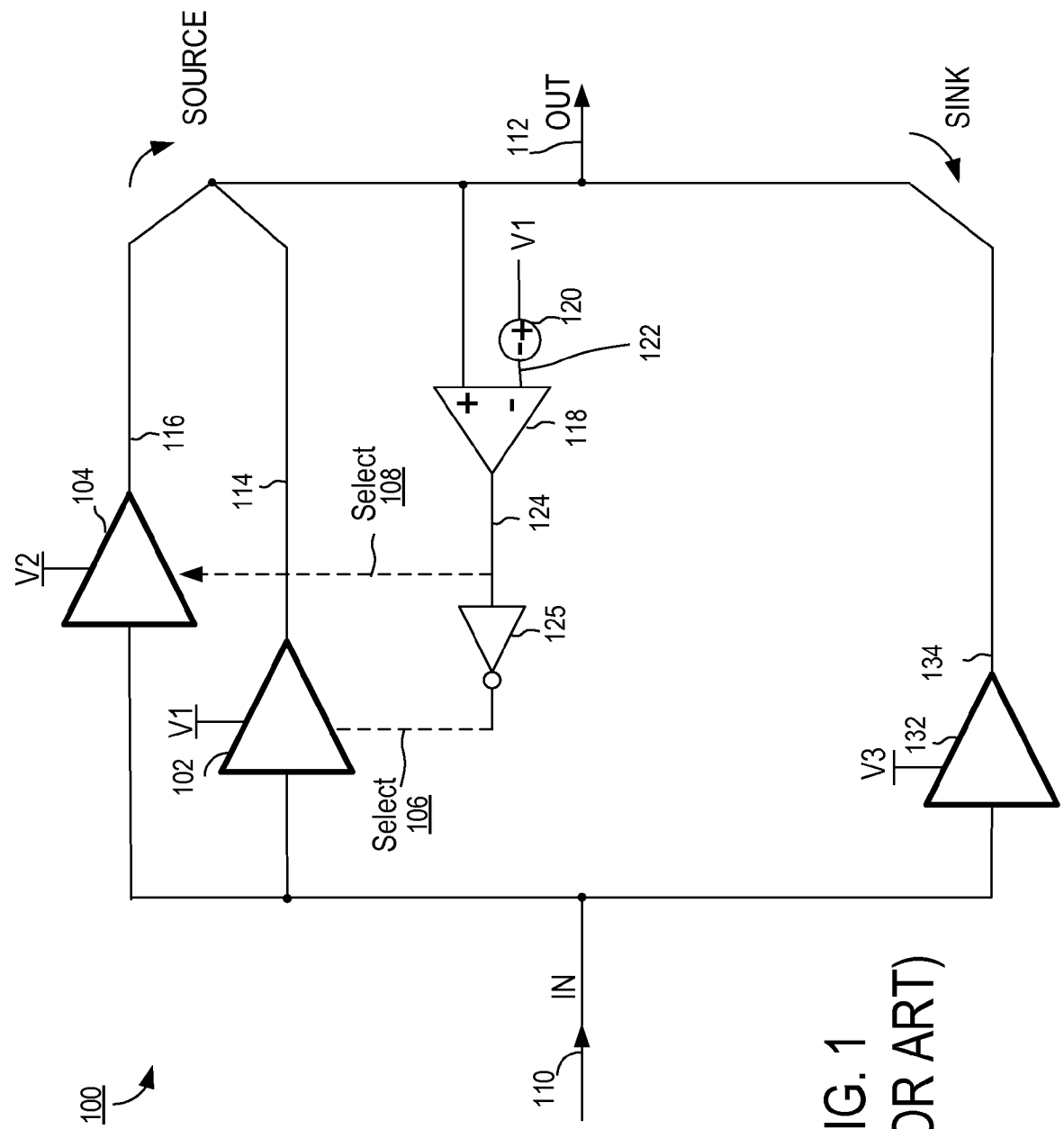
Figure 2B:
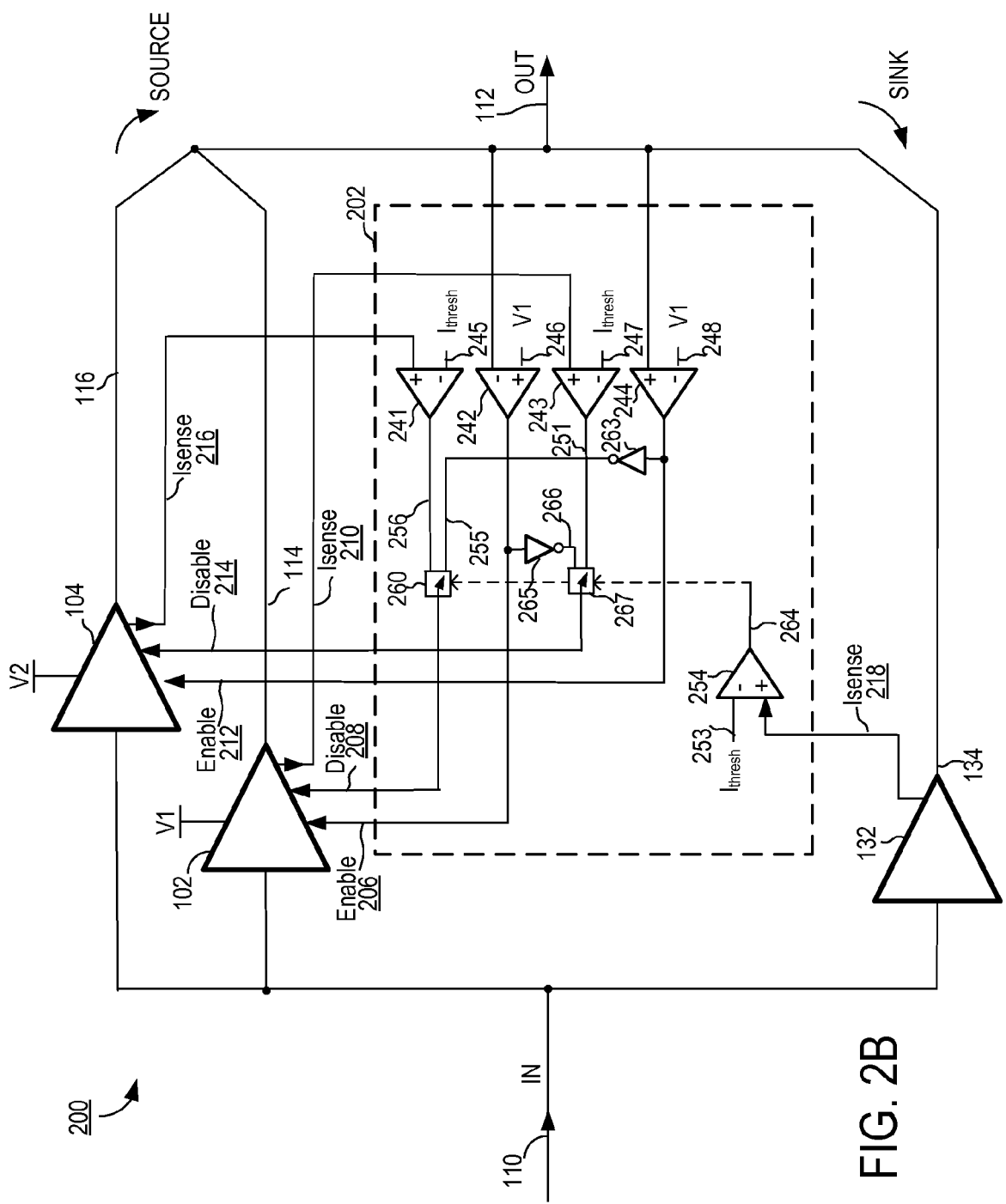
FIG. 2B illustrates the power supply system of FIG. 2A according to the first embodiment in more detail.

FIG. 2B illustrates the power supply system of FIG. 2A according to the first embodiment in more detail. Controller 202 includes comparators 241, 242, 243, 244, 254, inverters 263, 265, and switches 260, 267. Comparators 242 and 244 are both coupled to the output voltage 112 and the supply rail voltage V1 in opposing polarity, and compare the voltage at output 112 to the supply rail voltage V1 to enable source drivers 102 or 104, respectively. More specifically, if the output voltage 112 is smaller than supply rail voltage V1, enable signal 206 output from comparator 242 is asserted to enable driver 102, while enable signal 212 is not asserted and thus driver 104 is not enabled. If the output voltage 112 is higher than supply rail voltage V1, enable signal 212 output from comparator 244 is asserted to enable driver 104 while enable signal 206 is not asserted and thus driver 102 is not enabled. Note that the enable signals 206, 212 output from comparators 242 and 244 are capable of only enabling the source drivers 102 and 104, respectively, but not disabling them. Further, an offset such as offset 120 shown in FIG. 1 is not shown in the embodiment of FIG. 2, but may be included in the embodiment of FIG. 2B.

Source drivers 102 and 104 can be disabled utilizing the disable control signals 208, 214 derived from comparators 241 and 243, respectively. Note that the disable control signals 208, 214 are separate from the enable control signals 206, 212. More specifically, the current at the output 116 of source driver 104 is sensed as signal Isense 216, which is applied to the positive input of comparator 241 and causes the output 256 of comparator 241 to go high once Isense 216 exceeds a threshold $I_{thresh}$ 245 applied to the inverting input of comparator 241. Assuming switch 260 is in the closed position, in this example, a rising edge at the output 256 of comparator 241 causes source driver 102 to be disabled via the disable control signal 208. In a similar manner, the current at the output of source driver 102 is sensed as signal Isense 210, which is applied to the positive input of comparator 243 and causes the output 251 of comparator 243 to go high once Isense 210 exceeds a threshold $I_{thresh}$ 247 applied to the inverting input of comparator 243. Assuming switch 267 is in the closed position, a rising edge at the output 251 of comparator 243 causes source driver 104 to be disabled via the disable control signal 214. The values of $I_{thresh}$ 245 and $I_{thresh}$ 247 may both be equal to a few mA.

Thus, source driver 102 is enabled when the voltage at the output 112 is below the voltage at supply rail V1, but the other source driver 104 is not disabled until current flow above a threshold $I_{thresh}$ 247 has been established at the output 114 from source driver 102. Similarly, source driver 104 is enabled when the voltage at the output 112 is above the voltage at supply rail V1, but the other source driver 102 is not disabled until current flow above a threshold $I_{thresh}$ 245 has been established at the output 116 from source driver 104. Thus, a "glitch" caused by either source driver sourcing current during the supply rail switchover period is diminished, and distortion is reduced.

An exception to the operation described above is during the case when sink driver 132 is actively sinking current. In this case, the amplifier 200 may not be sourcing any current to output 112; thus current may not be flowing from either source driver 102 or 104, as part of the normal operation of the amplifier 200. In this case, the independent disabling of source drivers 102 and 104 via comparator outputs 256 and 251 must be disabled, since no current will be detected from either driver 104, 102 anyway. Switches 260 and 267, and inverters 263 and 265 are therefore added. The switches 260, 267 may be placed into a "bypass mode" to pass inverted signals 255 and 266 from comparators 244 and 242, respectively. In this "bypass" mode, source driver 102 is disabled when source driver 104 is enabled, and source driver 104 is enabled when source driver 102 is enabled, without regard to currents sensed at Isense 210 and Isense 216. In this manner, the switchover between source drivers 102 and 104 happens based solely on the voltage at output 112 according to the outputs of comparators 242, 244 regardless of the current sensed at the outputs of drivers 102, 104. Since no current is flowing in either source drivers 102 or 104, no glitch will be present at the output 112 during the transition between power supply rails V1 and V2.

In order to determine if sink driver 132 is sinking current, and so to determine if switches 260 and 267 should be placed in "bypass mode," current from its output is sensed as signal Isense 218 and provided to the positive input of comparator 254. Isense 218 is compared to current threshold $I_{thresh}$ 253 in comparator 254. If Isense 218 exceeds $I_{thresh}$ 253, i.e., sink driver 132 is sinking current exceeding the threshold value $I_{thresh}$ 253, the output 264 of comparator 254 goes high and sets switches 260 and 267 into the "bypass mode" positions.

Figure 2C:
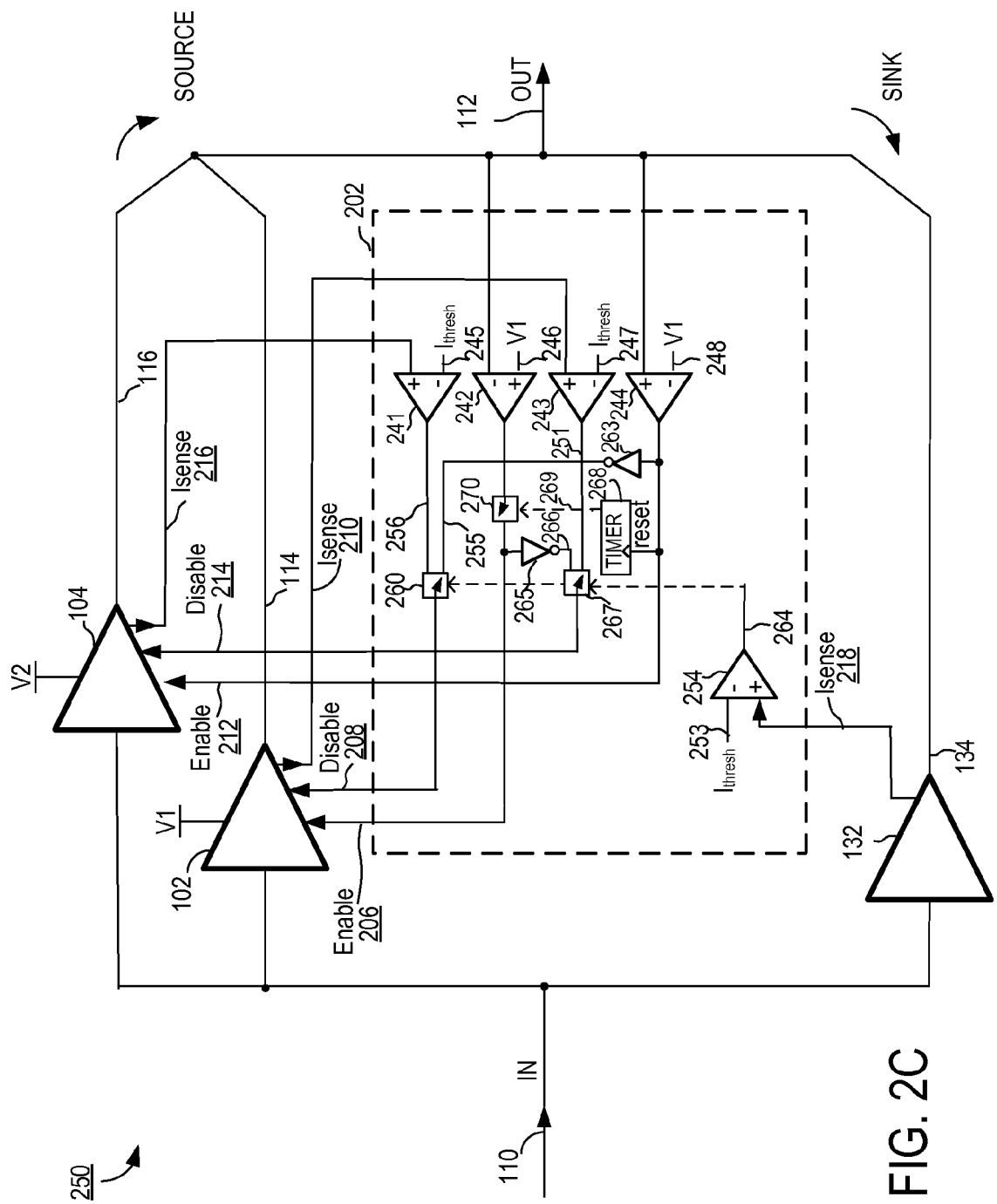
FIG. 2C illustrates a power supply system according to a second embodiment.

FIG. 2C illustrates a power supply system according to a second embodiment. The embodiment of FIG. 2C is substantially the same as the embodiment shown in FIG. 2B, except that timer 268 and switch 270 are added in the power supply system 250. Besides enabling source driver 104, the output 212 from comparator 244, when asserted, also resets timer 268 causing the timer 268 to count down from a predetermined timer period. While the timer 268 is counting, switch 270 is in the open position, preventing the enabling of source driver 102 until the timer 268 has timed out. Thus, the source driver 104 associated with the higher supply rail voltage V2 remains enabled during the predetermined timer period.

The purpose of this timer scheme is to further reduce distortion, by limiting the number of supply rail transitions, and thus limiting the frequency of the resulting "glitches." The choice of the predetermined timer period in the timer 268 is made based upon a tradeoff between overall efficiency of the amplifier and the distortion, since inhibiting the supply rail transitions reduces the efficiency benefit of the Class G amplifier. The optimum choice for the timer period will be the shortest period which still allows distortion goals to be met.

Figure 2D:
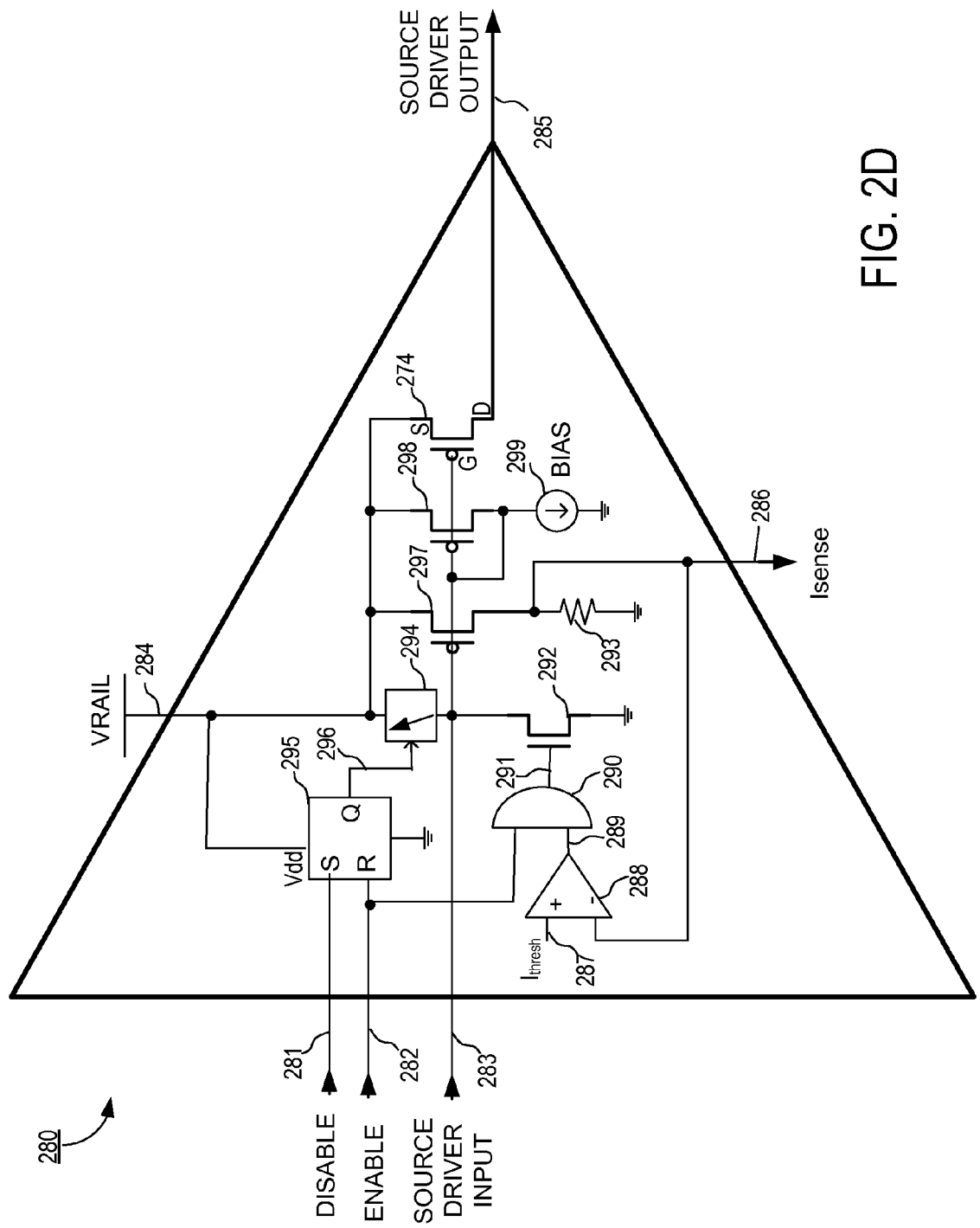
FIG. 2D illustrates example circuitry of a driver used in the power supply systems according to the embodiments of the present invention.

FIG. 2D illustrates example circuitry of a driver used in power supply systems according to the embodiments of the present invention. The example driver 280 could be used with either source drivers 102, 104 in the embodiments described above with FIGS. 2A, 2B, or 2C or to be described below with FIGS. 3A, 3B, 3C, 4, and 5. Driver 280 includes S-R flip-flop 295, switch 294, comparator 288, AND gate 290, n-channel MOSFET 292, p-channel MOSFETs 297, 298, 274, resistor 293, and current source 299. Driver 280 receives the ENABLE control signal 282, DISABLE control signal 281, and source driver input 283, is coupled to supply voltage rail VRAIL 284, and generates source driver output 285.

The signal path from source driver input 283 to source driver output 285 is essentially a MOSFET output transconductance stage, with P-channel MOSFET 274 serving as the output device, biased via mirrored P-channel MOSFET 298 and bias current source 299. S-R flip-flop 295 serves to enable or disable the driver 280 responsive to the enable signal 282 or disable signal 281, respectively. Responsive to a rising edge from disable signal 281, the output 296 of S-R flip-flop 295 goes high (i.e., S-R flip-flop 295 is set), and closes switch 294 and forces the gate of MOSFET 274 to become high, effectively shutting off outputs 285 and 286 and thereby disabling driver 280. Responsive to a rising edge from enable signal 282, the output 296 of S-R flip-flop 295 becomes low, and opens switch 294, permitting normal operation of the driver 280 and thereby enabling driver 280.

P-channel MOSFET 297 provides mirrored current from output MOSFET 274, providing a current proportional to the current output from MOSFET 274, and sources this current into resistor 293 to provide a current sense voltage output 286 referred to as Isense. As shown in FIGS. 2A, 2B, and 2C, current sense output 286 from the drivers are used for systems purposes as explained above. Within driver 280, Isense 286 is used for another purpose as well. Comparator 288 compares Isense 286 to a current threshold $I_{thresh}$ 287. Current threshold $I_{thresh}$ 287 may be a small value—perhaps a voltage corresponding to current of 10 µA measured across resistor 293 that corresponds to a few mA in the output of PFET 274. If Isense 286 is lower than $I_{thresh}$ 287, the output 289 of comparator 288 goes high and the output 291 of AND gate 290 also becomes high if the driver 280 is enabled (enable 282 is high). Thus, N-channel MOSET 292 turns on, which in turn drives the gate of output MOSFET 274 low. Thus, the output 285 of MOSFET 274 is turned on hard, inducing current to flow quickly from VRAIL 284 to output 285. As soon as Isense 286 exceeds $I_{thresh}$ 287, the output 289 of comparator 288 and the output 291 of AND gate 290 become low, thereby turning off MOSFET 292, returning control of the gate of output MOSFET 274 to source driver input 283. Effectively, this circuit comprised of comparator 288, AND gate 290, and N-channel MOSFET 292 coupled to the gate of output MOSFET 274 speeds up the turn-on of the driver 280 by temporarily overdriving the gate of MOSFET 274, and removing the overdrive once the MOSFET device 274 is turned on, further reducing a "glitch" present when the driver 280 is initially enabled.

Figure 3A:
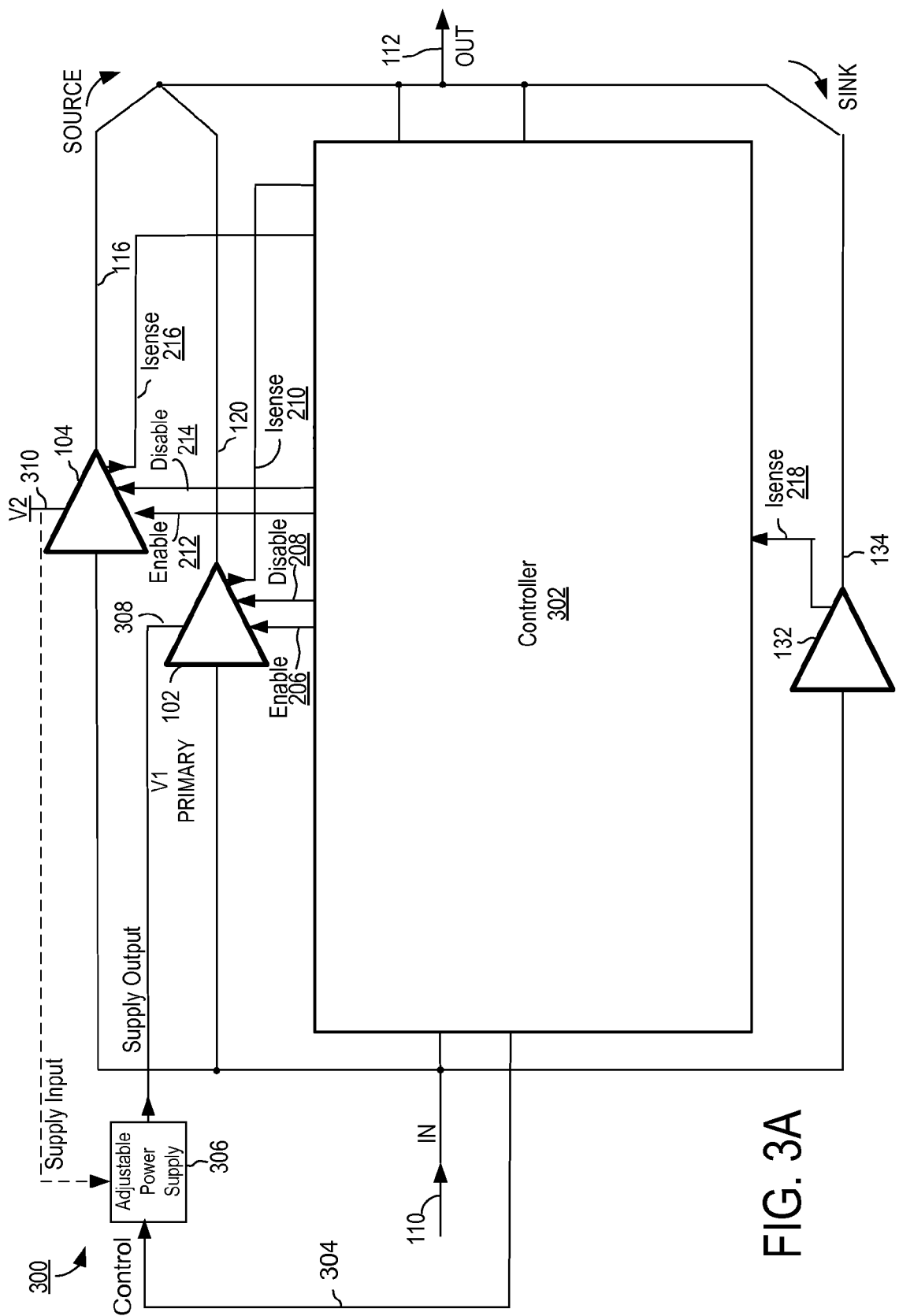
FIG. 3A illustrates a power supply system according to a third embodiment.

FIG. 3A illustrates a power supply system according to a third embodiment. The power supply 300 of FIG. 3A is substantially similar to the power supply 200 of FIG. 2A, except that an adjustable power supply 306 provides the supply rail voltage V1 308 for source driver 102 and controller 302 controls the supply rail voltage V1 308 provided by adjustable power supply 306 via control signal 304 in a servo-control loop fashion. The supply rail voltage V1 308 is adjusted so that this supply rail V1 and corresponding source driver 102 may serve as the primary supply rail for output 112 for most of the time, while still allowing occasional transitions to supply rail V2 310 during peaks in the output voltage 112. A higher voltage at supply rail V1 308 will typically result in fewer transitions to supply rail V2 310, since the voltage at output 112 will more consistently remain below the voltage of V1 308, thus reducing the frequency of need to switch to supply rail V2 310. A system may be employed, such that adjustable power supply 306 adjusts voltage V1 308 to target a desired frequency of transitions between supply rails V1 and V2. As previously mentioned, a reduced frequency of transitions between supply rails reduces distortion at the output 112.

Figure 3B:
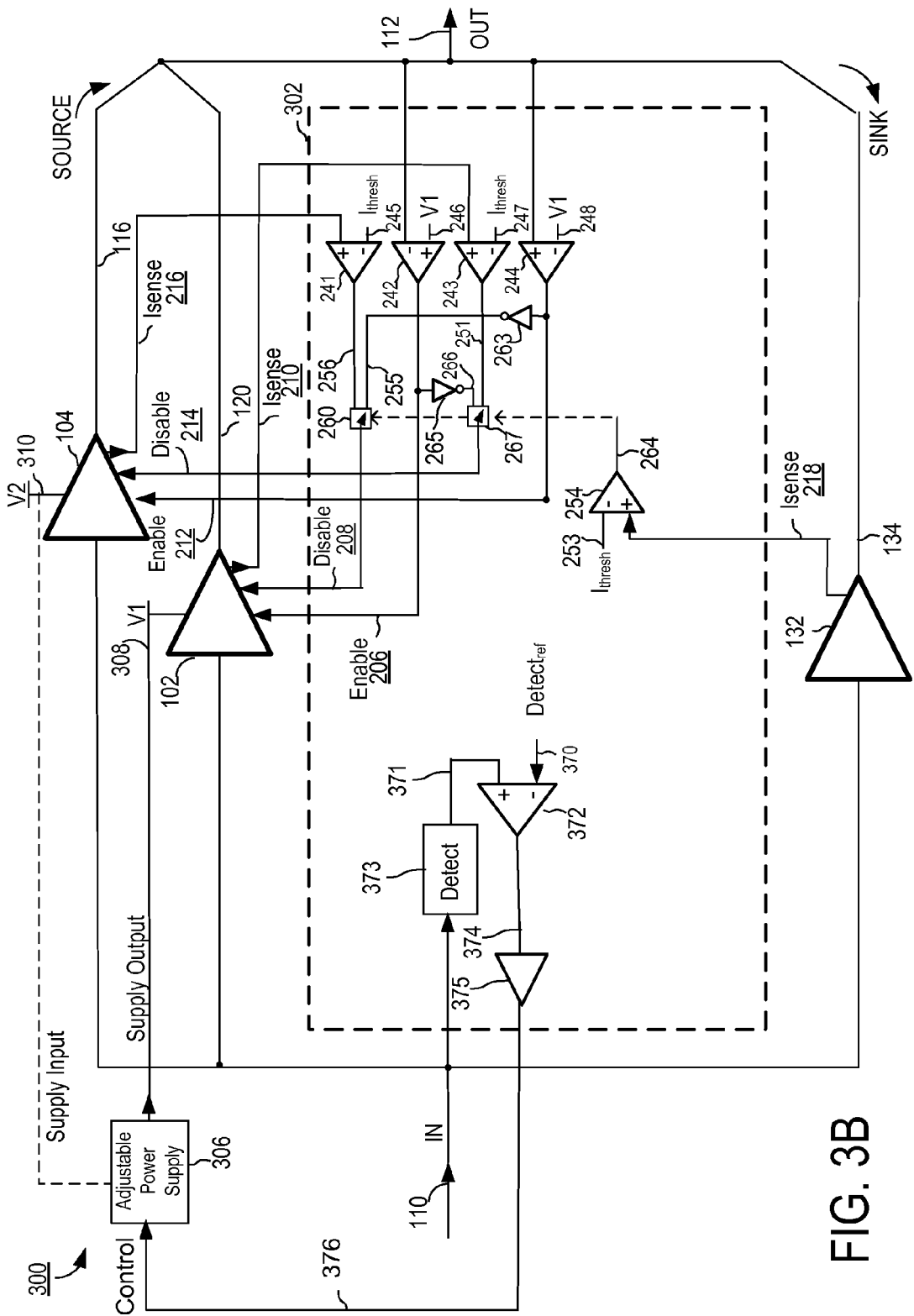
FIG. 3B illustrates one example of the power supply system of FIG. 3A according to the third embodiment in more detail.

FIG. 3B illustrates one example of the power supply system of FIG. 3A according to the third embodiment in more detail. In FIG. 3B, details according to one example of controller 302 are shown. As before, comparators 242 and 244 compare the voltage at output 112 to the voltage at supply rail V1 308, and enable source drivers 102 or 104 via enable signals 206, 212, respectively. Source drivers 102, 104 are also disabled based upon current detected from source drivers 104 and 102, respectively, via separate disable signals 208, 214, respectively. However, in this example of FIG. 3B, circuitry comprised of detector 373, amplifier 372, gain element 375 is added. Detector 373 detects the amplitude of input signal 110 and outputs a signal 371 indicative of this amplitude. The output of amplitude detector 373 may indicate the peak amplitude of input signal 110, and may be implemented by a diode detector (details not shown herein). If the amplitude of input signal 110 is increased, the output 371 of detector 373 sets the non-inverting input of amplifier 372 to a higher level, thus increasing the output 374 of amplifier 372. Likewise, if the amplitude of input signal 110 is decreased, the output 371 of detector 373 sets the non-inverting input of amplifier 372 to a lower level, thus decreasing the output 374 of amplifier 372. The gain of amplifier 372 and the signal level of Detect$_{ref}$ 370, together with the gain of amplifier 372 are set so that the control 374 of adjustable power supply 306 adjusts the supply output of adjustable power supply 306 to supply rail V1 (308) to a level which targets a reasonable frequency of transitions between supply rails V1 and V2—at a level where distortion targets are met, while achieving acceptable efficiency in the system. Gain element 375 may include frequency shaping components and thus shape the frequency response of the system. Adjustable power supply 308 may be a step-down switching regulator. Its input may be connected to supply rail V2, and supplies the primary supply rail V1 efficiently derived from supply rail V2. Note that while FIG. 3B shows adjustable power supply 306 as being responsive to the amplitude of input 110, output 112 may be substituted for input 110 to serve as the basis for controlling the supply output of adjustable power supply 306.

Figure 3C:
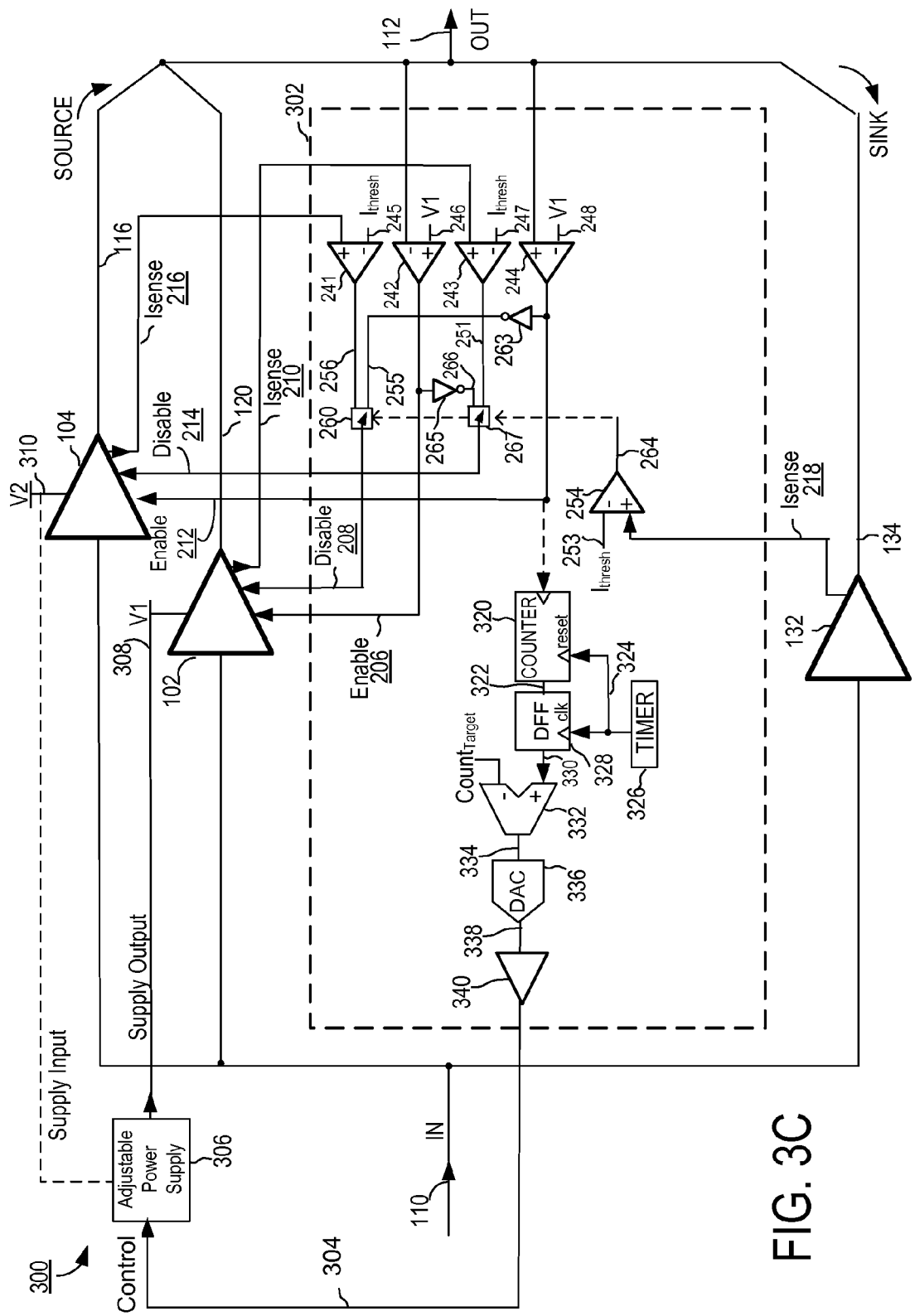
FIG. 3C illustrates another example of the power supply system of FIG. 3A according to the third embodiment in more detail.

FIG. 3C illustrates another example of the power supply system of FIG. 3A according to the third embodiment in more detail. In FIG. 3C, the details according to another example of controller 302 are shown. As before, comparators 242 and 244 compare the voltage at output 112 to the voltage at supply rail V1 308, and enable source drivers 102 or 104 via enable signals 206, 212, respectively. Source drivers 102, 104 are also disabled based upon current detected from source drivers 104 and 102, respectively. However, in this embodiment of FIG. 3B, circuitry comprised of counter 320, D-flip-flop 328, adder 332, digital-to-analog converter (DAC) 336, and gain element 340 is added. Counter 320 counts the number of times the system transitions from supply rail V1 to supply rail V2 before being reset 324 periodically by timer 326. The output 212 of comparator 244, which is used to enable source driver 104 and is thus an indication of a transition to supply rail V2, serves to increment counter 286. Timer 326 is a fixed period timer and resets 324 counter 320 at the end of each period. Simultaneously, the output 330 of DFF (D-type flip-flop) 328 latches the maximum count value 322 of counter 320 prior to being reset. Adder 332 computes the difference between the output 330 of DFF 328 and the targeted count Count$_{Target}$. Count$_{Target}$ is set to hold the value of the desired target number of transitions from supply rails V1 to V2 during the fixed time period determined by timer 326, and is thus an indication of the frequency such transitions. A positive value at the output 334 of adder 332 indicates that more transitions have been counted than the desired Count$_{Target}$, while a negative value at the output 334 of adder 332 indicates fewer transitions have been counted than the desired Count$_{Target}$. Count$_{Target}$ is chosen to be a value low enough to limit the frequency of transitions from supply rail V1 to V2 in order to reduce distortion in the power supply system 300, but high enough to allow supply rail V1 to operate at a reasonably low voltage and sufficiently allow transitions to supply rail V2 when needed to improve the efficiency of the power supply system 300.

DAC 336 converts the output 334 of adder 332 to an analog voltage 338. Since analog voltage 338 indicates the difference between the desired and actual V1 to V2 transition frequencies, it is indicative of an error signal. Gain element 340, which may be an integrator and may include frequency shaping components, may then amplify and shape this error signal 338. This amplified and shaped error signal 304 then controls adjustable power supply 306 to adjust the supply voltage output to supply rail V1 308. Thus, a servo-control loop is formed such that adjustable power supply 306 adjusts supply rail voltage V1 308 to target a desired frequency of transitions between supply rails V1 and V2. As mentioned previously Count$_{Target}$ may be set to a level where distortion targets are met, while achieving acceptable efficiency in the system. Adjustable power supply 308 may be a step-down switching regulator. Its input may be connected to supply rail V2, and supplies the primary supply rail V1 efficiently derived from V2.

Figure 3D:
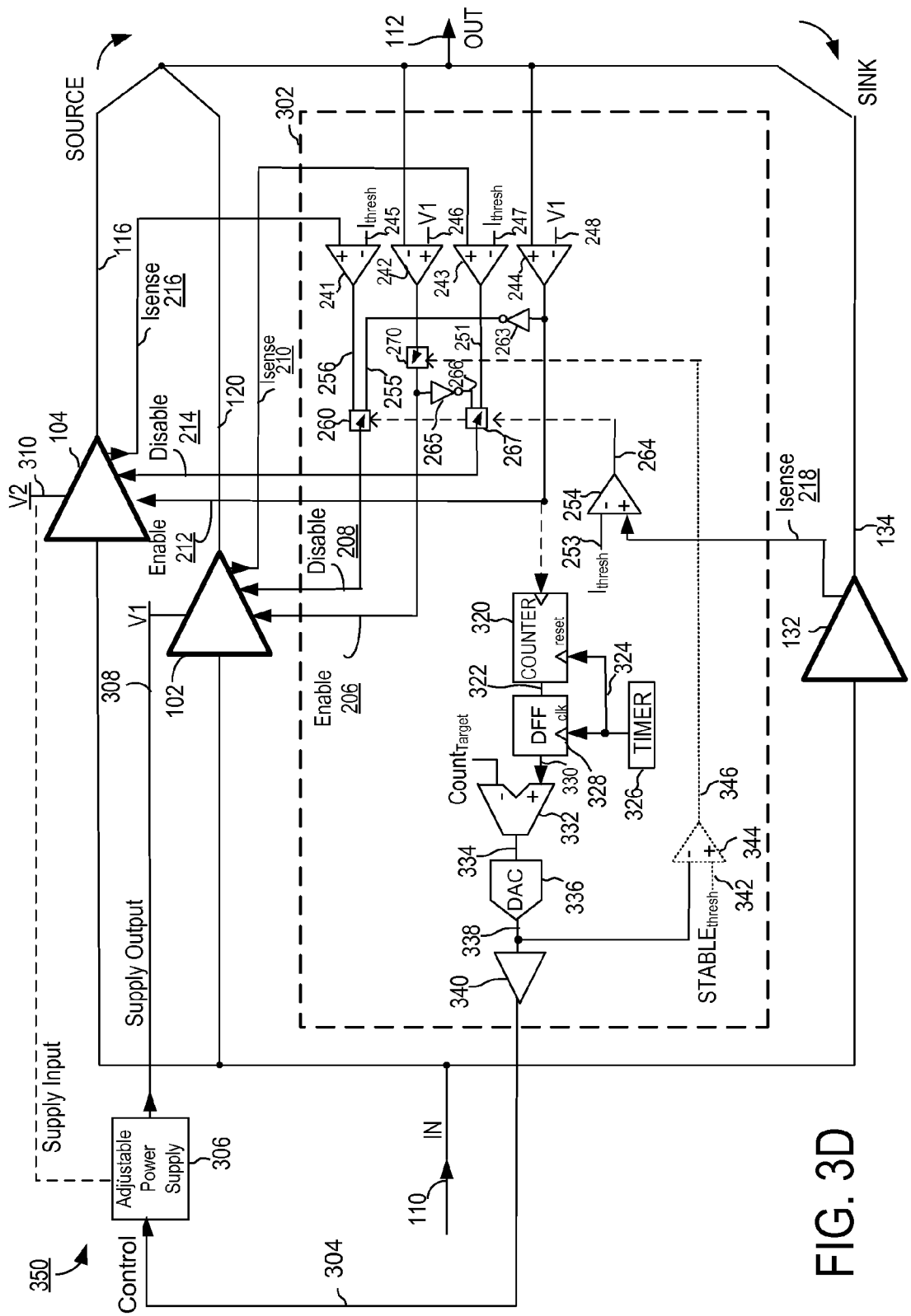
FIG. 3D illustrates a power supply system according to a fourth embodiment.

FIG. 3D illustrates a power supply system according to a fourth embodiment. The power supply system 350 of FIG. 3C is substantially the same as the power supply system 300 of FIG. 3A, except that the power supply system 350 additionally includes comparator 344 and switch 270. Comparator 344 monitors if analog voltage error signal 338 exceeds a stability threshold STABLE$_{thresh}$ 342. An excessive signal at the analog voltage error signal 338 indicates that the power supply system 350 is experiencing excessive V1 to V2 transitions and is unstable, which may occur during startup or transient periods during abrupt amplitude changes at output 112. Stability threshold STABLE$_{thresh}$ 342 is set to a value that represents V1 to V2 transitions outside the normal operating range when operating within the servo loop described above. If the number of V1 to V2 transitions exceeds that represented by stability threshold STABLE$_{thresh}$ 342, the output 346 of comparator 344 goes high and opens switch 270. When switch 270 is open, the enable signal 206 of source driver 102 is inhibited, causing the power supply system 350 to use supply rail V2 exclusively. While this mode of operation is less efficient, it prevents bursts of distortion during these transient periods, and as soon as adjustable power supply 306 adjusts supply rail V1 to a level which results in fewer V1 to V2 transitions than the desired target represented by stability threshold STABLE$_{thresh}$ 342, switch 270 closes once again and the power supply system 350 returns to normal operation.

While the system described in FIGS. 3A, 3B, 3C, and 3D include the specific examples and components shown in the drawings, these are offered merely as examples of control of adjustable power supply 306. Other systems which control adjustable power supply 306 to achieve a target frequency of transitions between source drivers 102 and 104 may be substituted.

Figure 4:
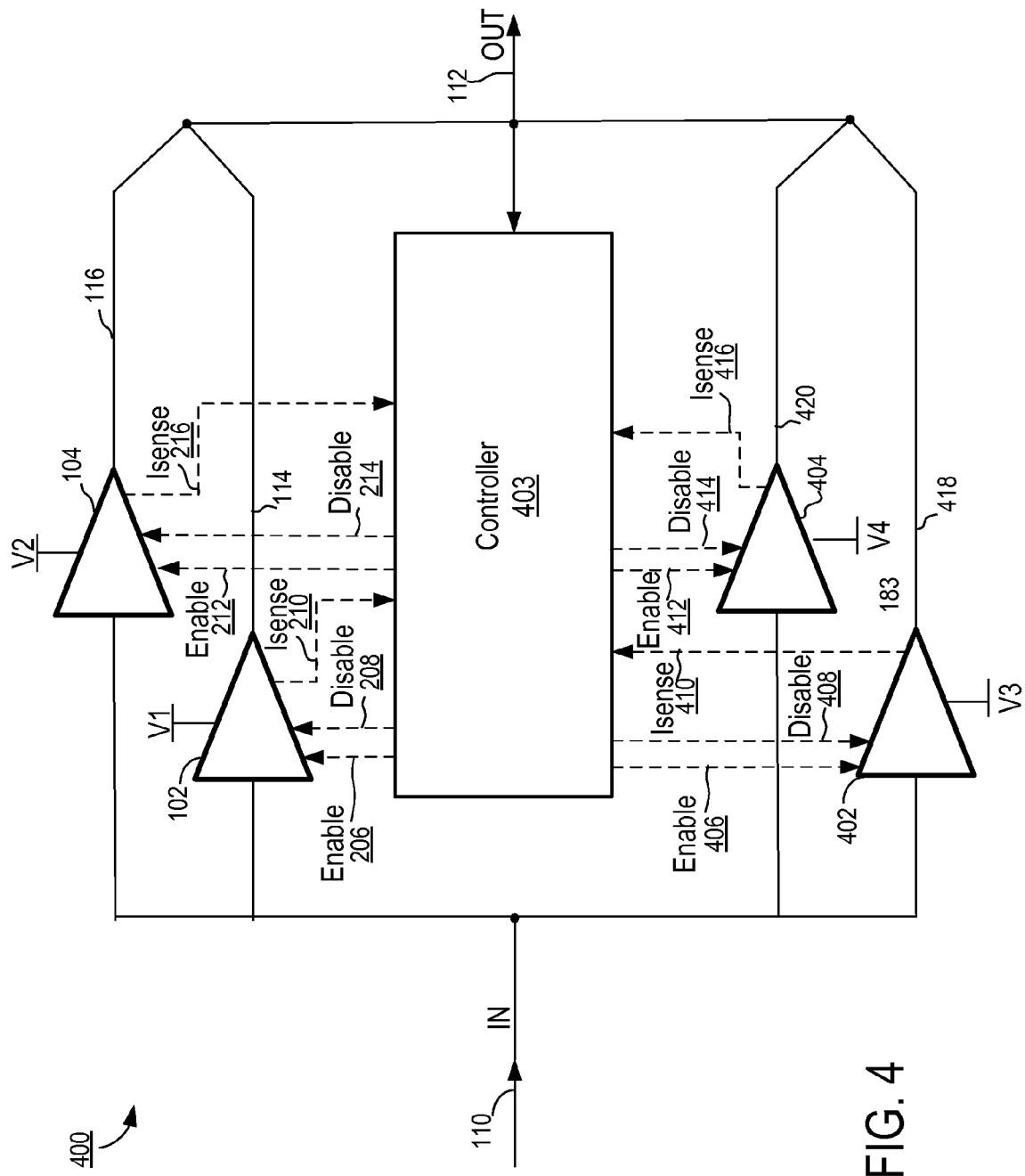
FIG. 4 illustrates a power supply system according to a fifth embodiment.

FIG. 4 illustrates a power supply system according to a fifth embodiment. This power supply system 400 of FIG. 4 is similar to power supply system 200 of FIG. 2A, but is modified to operate in a bipolar scheme. Current sink driver 132 of FIG. 2A is replaced by two current sink drivers 402, 404 that are associated with negative supply rails V3 and V4, respectively. Voltage V4 is assumed to be less than voltage V3. Controller 403 generates enable signals 406, 412 and disable signals 408, 414 associated with current sink drivers 402, 404, in addition to the enable signals 206, 212 and disable signals 208, 214 associated with source drivers 102, 104. The enable signals 406, 412 enable the source drivers 402, 404, respectively, and disable signals 408, 414 disable the source drivers 402, 404, using supply rail V4 as the transition threshold for supply rail transition between V3 and V4, in a manner similar to how the source drivers 102, 104 are enabled and disabled using supply rail V1 as the transition threshold for supply rail transition between V1 and V2. Enable signals 406, 412 and disable signals 408, 414 may be edge triggered. As well, controller 402 senses the output current of source drivers 402, 404 as signals Isense 410 and Isense 416, respectively, which are input to the controller 402. Such output current may be sensed by current mirroring transistors (not shown) associated with the main driver output current transistors used in the drivers, similar to what is shown in FIG. 2D. Finally, in a manner similar to that described in FIG. 2B, the independent disabling of source drivers 102 and 104 must be disabled if either sink drivers 402 or 404 are sinking current. As well, the independent disabling of sink drivers 402 and 404 must be disabled if either source drivers 102 or 104 are sourcing current.

Figure 5:
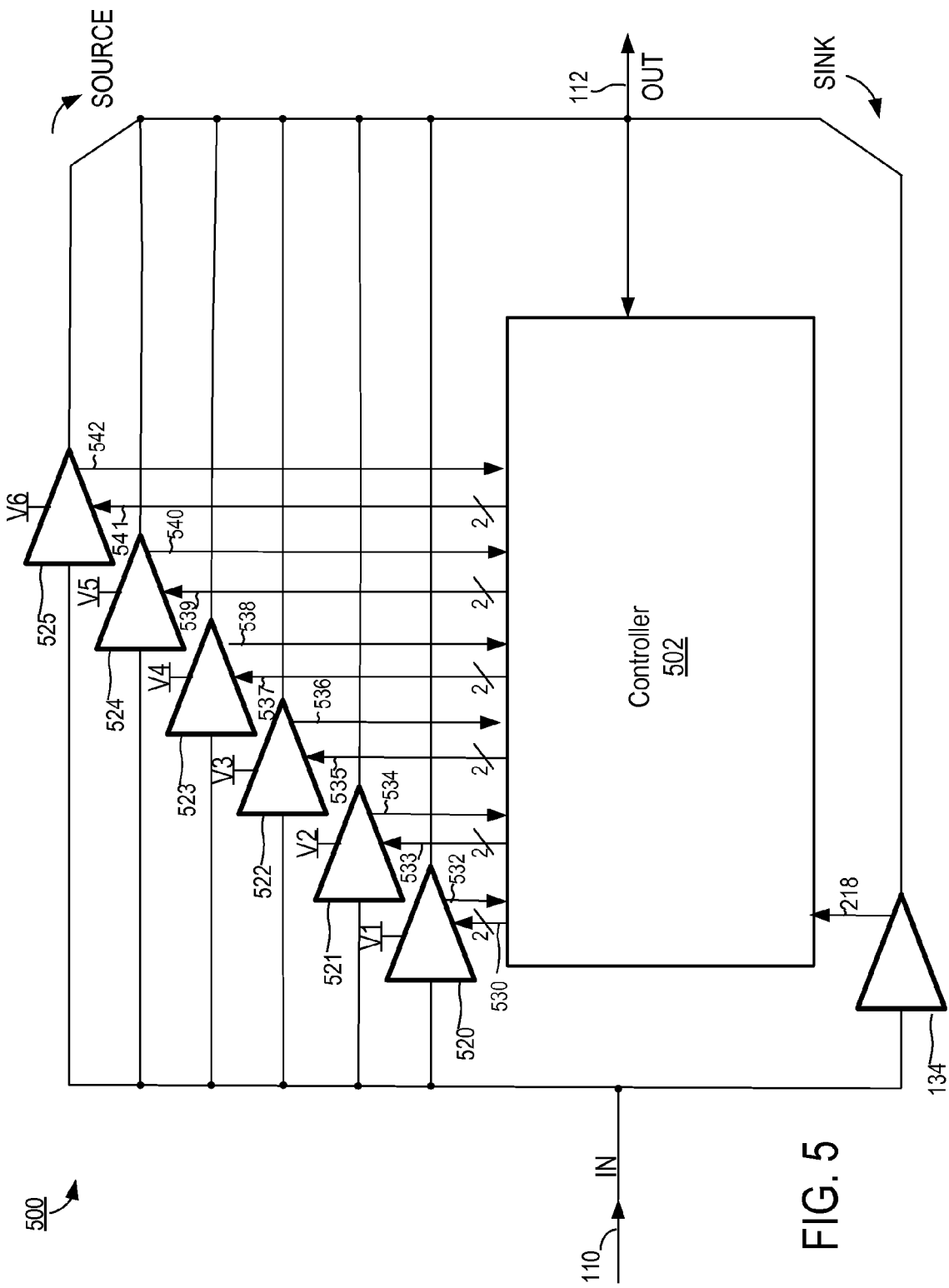
FIG. 5 illustrates a power supply system according to a sixth embodiment.

FIG. 5 illustrates a power supply system according to a sixth embodiment. Power supply system 500 of FIG. 5 is similar to power supply system 200 of FIG. 2A, except that power supply system 500 is used with a multiplicity of supply voltage rails V1 through V6. Supply rails V1 through V6 may be more closely spaced than supply rails V1 and V2 in power supply system 200 of FIG. 2A and are presumed to be increasing in voltage, with V1 at the lowest voltage and V6 at the highest voltage. The source drivers 520, 521, 522, 523, 524, 525 are each associated with the supply rails V1, V2, V3, V4, V5, and V6, respectively, and are enabled or disabled via the enable/disable signals 530, 533, 535, 537, 539, 541 similar to enabling or disabling of the source drivers 102, 104 in the power supply system 200 of FIG. 2A. Note that the signal lines 530, 533, 535, 537, 539, 541 correspond to both enable and disable signals but are shown in FIG. 5 as one line for simplicity of illustration. Current sense signals 532, 534, 536, 538, 540, 542 provide information on the output current of the source drivers 520, 521, 522, 523, 524, 525, respectively, to controller 502, similar to the Isense signals 210, 216 illustrated in the embodiment of FIG. 2A. The scheme described above with reference to FIGS. 2A, 2B, and 2C may be naturally extended to accommodate the larger number of source drivers simply by increasing the numbers of comparators in the controller 502 and modifying the timer function to reset at every transition to a higher voltage supply rail.

With such arrangement, the power supply system 500 may be switched to operate off of one of the six supply rail voltages V1 through V6 to minimize the difference between the chosen supply rail voltage and the amplifier output voltage 112. Because such supply rail voltages V1 through V6 can be chosen to more closely follow the voltage at the output 112 with finer granularity, the efficiency of the power supply system 500 is improved. This is because, as mentioned previously, the power equal to the voltage difference between the supply rail and the amplifier output, multiplied by the current, is dissipated as heat.

Figure 6B:
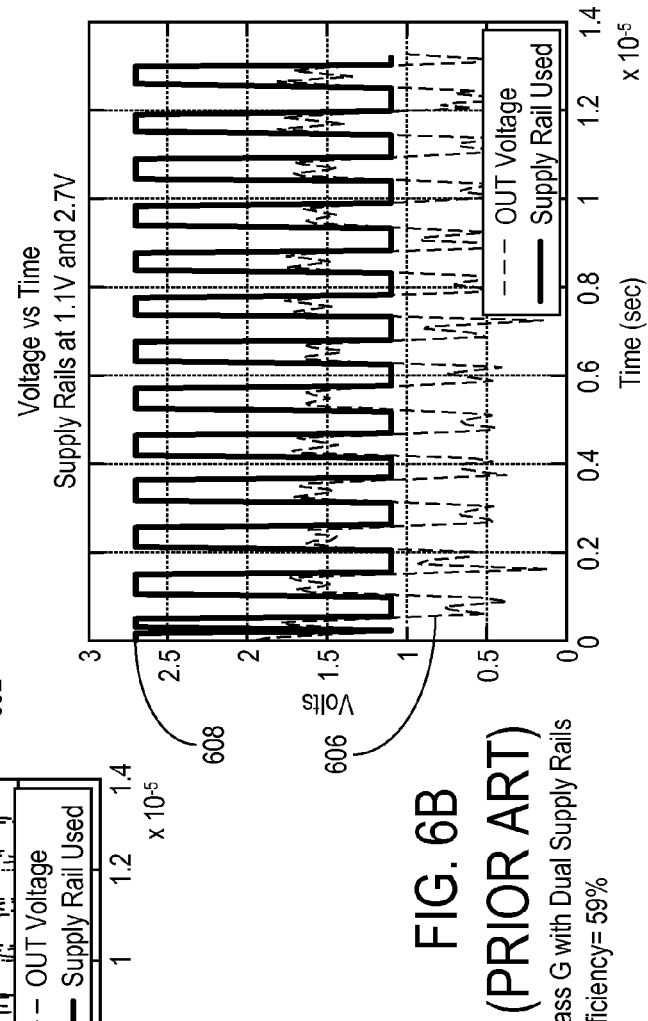
FIGS. 6A and 6B illustrate output voltage waveforms of conventional power supply systems.
Figure 6A:
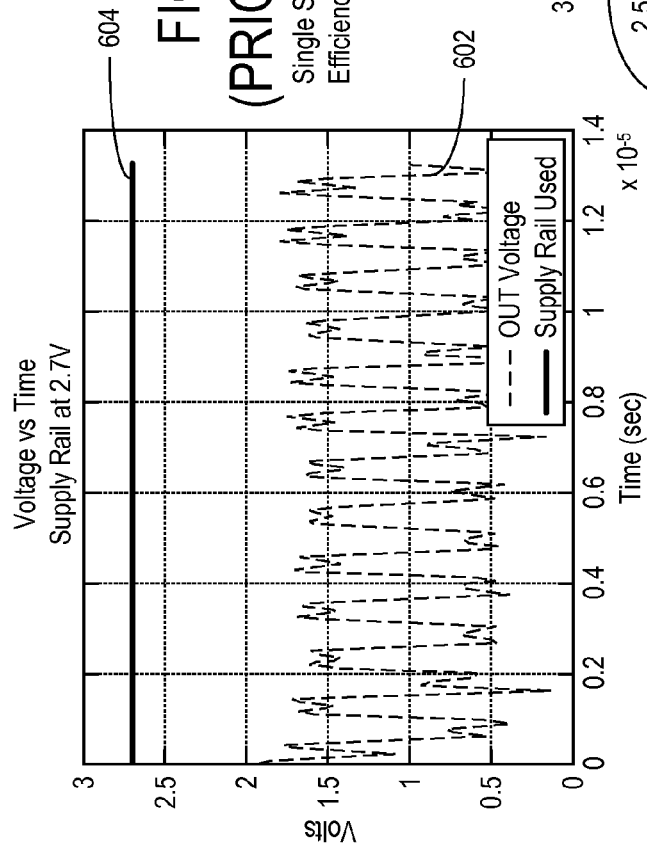

FIG. 6A illustrates the output voltage 602 of a power supply system using only a single supply rail (e.g., at 2.7 volt) 604. The output voltage 602 corresponds to the amplifier output 112 shown in FIGS. 2A, 2B, 2C, 3A, 3B, 3C, and in this case is an example amplitude modulation waveform from a 3Gpp HSDPA cellular system. The efficiency of such conventional power supply system was simulated to be approximately 49%.

FIG. 6B illustrates the output voltage 606 a power supply system using a conventional class G amplifier that does not include any of the features of the present invention described herein, with the supply voltage 608 transitioning between dual supply rails (e.g., at 1.1 volt and 2.7 volt). The efficiency of such conventional power supply system was simulated to be approximately 59%.

FIG. 6C illustrates the output voltage 612 of a power supply system such as that shown in the second embodiment of FIG. 2C where the timer 268 was set at a predetermined timer value to limit the frequency of switching 614 between supply rails V1 and V2 (e.g., 1.1 volt and 2.7 volt) to be less than 1/0.75 microseconds. The efficiency of such power supply system was simulated to be approximately 52%.

FIG. 6D illustrates the output voltage 616 of a power supply system such as that shown in the third embodiment of FIG. 3B where the voltage of the primary supply rail V1 is dynamically adjusted by adjustable power supply 306 to limit the frequency of switching 618 from supply rail V1 to supply rail V2 (e.g., 2.7 volt) to be less than 1/0.75 microseconds (i.e., $Count_{Target}$ is set at 1/0.75 microseconds (average)). In this case, the supply voltage rail V1 settles to approximately 1.7 V. The efficiency of such power supply system was simulated to be approximately 70%.

Figure 7:
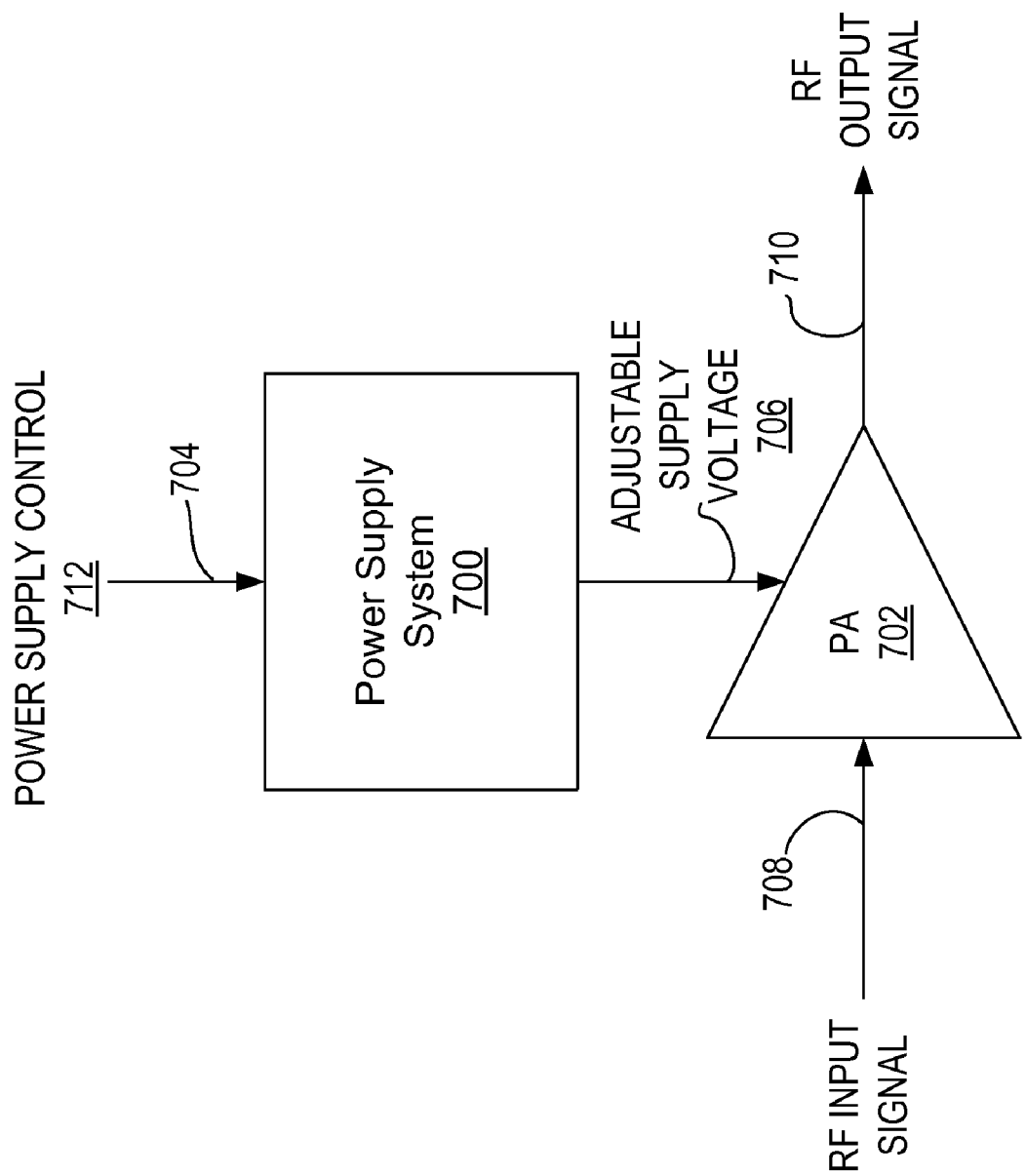
FIG. 7 illustrates an example of an application in which the power supply system according to the various embodiments may be used.

FIG. 7 illustrates an example of an application in which the power supply system according to the various embodiments described herein may be used. The power supply system 700 can be any one of the power supply systems 200, 250, 300, 350, 400, 500 as illustrated herein with reference to FIGS. 2A, 2B, 2C, 3A, 3B, 3C, 4, and 5. Power supply system 700 is used with a RF PA system in which the PA 702 receives and amplifiers an RF input signal 708 such as a transmit signal of a cellular system and generates an RF output signal 710. The power supply system 700 generates an adjustable supply voltage 706 to power the PA 702 and adjust the bias of PA 702. Power supply system 700 adjusts the supply voltage 706 based on a power supply control signal 712, which corresponds to the input control signal 110 of the various power supply systems illustrated herein, while the adjustable supply voltage 706 corresponds to the output 112 with reference to FIGS. 2A, 2B, 2C, 3A, 3B, 3C, 4, and 5. In one embodiment, the power supply control signal 712 tracks the amplitude of the modulation passed through PA 702. PA 702 is therefore supplied with a varying voltage that improves efficiency. Although the power supply system 700 is illustrated herein as used to provide the adjustable supply voltage 706 to a PA 702 in a RF PA system, the various embodiments of the power supply systems described herein are not limited to use in RF PA systems and can be used to provide power in other applications.

Upon reading this disclosure, those of skill in the art will appreciate still additional alternative designs for a high bandwidth, high efficiency power supply system with low distortion. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the present invention.

What is claimed is:

1. A power supply system, comprising:
   an input node for receiving an input signal;
   an output node for driving a load;
   a plurality of output drivers whose inputs are coupled to the input node and outputs are coupled to the output node, each of the output drivers being powered by different supply rail voltages; and a controller configured to enable each of the output drivers via an associated enable control signal and disable each of the output drivers via an associated disable control signal separate from the enable control signal associated with each output driver, the controller configured to enable one or more of the output drivers via the associated enable control signal depending upon an output voltage level at the output node while disabling remaining ones of the output drivers via the associated disable control signal.

2. The power supply system of claim 1, wherein the output drivers include:

a first source driver configured to receive the input signal and generate a first output responsive to the input signal, the first source driver being powered by a first supply rail voltage; and a second source driver configured to receive the input signal and generate a second output responsive to the input signal, the second source driver being powered by a second supply rail voltage, and wherein the controller is configured to enable the first source driver via a first enable signal responsive to the output voltage being lower than the first supply rail voltage and to enable the second source driver via a second enable signal responsive to the output voltage being higher than the first supply rail voltage, and wherein the controller is further configured to disable the first source driver via a first disable signal separate from the first enable signal when the second source driver is enabled and configured to disable the second source driver via a second disable signal separate from the second enable signal when the first source driver is enabled.

3. The power supply system of claim 2, wherein the controller is configured to disable the first source driver via the first disable signal only after output current from the second source driver exceeds a predetermined threshold current.

4. The power supply system of claim 3, wherein the controller includes a comparator configured to compare the output current from the second source driver with the predetermined threshold current, the comparator generating the first disable signal responsive to the output current from the second source driver exceeding the predetermined threshold current.

5. The power supply system of claim 2, further comprising one or more sink drivers for sinking current from the output node, the controller further configured to disable the first source driver when the second source driver is enabled, responsive to the sink current from the output node exceeding a predetermined threshold sink current.

6. The power supply system of claim 2, wherein the power supply system is configured for use in a bipolar system, the power supply system further comprising:

a first sink driver configured to receive the input signal and generate a third output responsive to the input signal, the first sink driver being powered by a third supply rail voltage; and a second sink driver configured to receive the input signal and generate a fourth output responsive to the input signal, the second sink driver being powered by a fourth supply rail voltage, wherein:

the first and second supply rail voltages are positive voltages and the third and fourth supply rail voltages are negative voltages;

the controller is further configured to enable the first sink driver or the second sink driver via a third enable signal or a fourth enable signal, respectively, and the controller is further configured to disable the first sink driver or the second sink driver via a third disable signal or a fourth disable signal, respectively.

7. The power supply system of claim 2, wherein each of the first source driver and the second source driver, when enabled, is configured to generate an output current larger than normal output current corresponding to the input signal, until the output current exceeds a predetermined threshold output current.

8. The power supply system of claim 1, wherein an output voltage of the power supply system powers a power amplifier of a radio frequency power amplifier system.

9. A power supply system, comprising:

an input node for receiving an input signal;

an output node for driving a load;

a plurality of output drivers whose inputs are coupled to the input node and outputs are coupled to the output node, each of the output drivers being powered by different supply rail voltages and configured to be enabled by an associated enable control signal; and a controller configured to enable one or more of the output drivers via the associated enable control signal depending upon an output voltage level at the output node, and wherein the controller is configured to limit a frequency of switching of enabling between the output drivers to be less than a predetermined threshold.

10. The power supply system of claim 9, wherein the output drivers include:

a first source driver configured to receive the input signal and generate a first output responsive to the input signal, the first source driver being powered by a first supply rail voltage; and a second source driver configured to receive the input signal and generate a second output responsive to the input signal, the second source driver being powered by a second supply rail voltage, and wherein the controller is configured to enable the first source driver via a first enable signal responsive to the output voltage being lower than the first supply rail voltage and to enable the second source driver via a second enable signal responsive to the output voltage being higher than the first supply rail voltage, and wherein the controller includes a timer that determines an amount of time passed since the second source driver became enabled, the controller further configured to prohibit enabling of the first source driver until said amount of time exceeds a predetermined time limit.

11. The power supply system of claim 9, wherein the output drivers include:

a first source driver configured to receive the input signal and generate a first output responsive to the input signal, the first source driver being powered by a first supply rail voltage; and a second source driver configured to receive the input signal and generate a second output responsive to the input signal, the second source driver being powered by a second supply rail voltage, and wherein the controller is configured to enable the first source driver via a first enable signal responsive to the output voltage being lower than the first supply rail voltage and to enable the second source driver via a second enable signal responsive to the output voltage being higher than the first supply rail voltage, and wherein the power supply system further comprises an adjustable power supply providing the first supply rail voltage, the controller further configured to adjust the first supply rail voltage such that the frequency of switching of enabling between the first and second source drivers is less than the predetermined threshold.

12. The power supply system of claim 11, wherein the controller adjusts the first supply rail voltage provided by the adjustable power supply responsive to an amplitude of the input signal at the input node or the output voltage at the output node.

13. The power supply system of claim 11, wherein the adjustable power supply is coupled to the second supply rail voltage and generates the adjustable first supply rail voltage as a step-down voltage of the second supply rail voltage.

14. The power supply system of claim 9, wherein an output voltage of the power supply system powers a power amplifier of a radio frequency power amplifier system.

15. In a power supply system, a method of generating an output voltage, the method comprising:
receiving an input signal at an input node; and
generating the output voltage at an output node for driving a load using one or more of a plurality of output drivers whose inputs are coupled to the input node and outputs are coupled to the output node, each of the output drivers being powered by different supply rail voltages,
wherein each of the output drivers is enabled via an associated enable control signal and disabled via an associated disable control signal separate from the enable control signal associated with each output driver, and the one or more of the output drivers are enabled via the associated enable control signal depending upon the output voltage at the output node while remaining ones of the output drivers are disabled via the associated disable control signal.

16. The method of claim 15, wherein generating an output voltage includes:
generating a first output responsive to the input signal using a first source driver powered by a first supply rail voltage;
generating a second output responsive to the input signal using a second source driver powered by a second supply rail voltage;
enabling the first source driver via a first enable signal responsive to the output voltage of the power supply system being lower than the first supply rail voltage;
enabling the second source driver via a second enable signal responsive to the output voltage being higher than the first supply rail voltage;
disabling the first source driver via a first disable signal separate from the first enable signal when the second source driver is enabled;
disabling the second source driver via a second disable signal separate from the second enable signal when the first source driver is enabled; and
providing the output voltage based on the first output or the second output responsive to whether the first source driver or the second source driver, respectively, is enabled.

17. The method of claim 16, further comprising disabling the first driver via the first disable signal only after output current from the second source driver exceeds a predetermined threshold current.

18. The method of claim 16, further comprising disabling the first source driver when the second source driver is enabled, responsive to sink current from an output node of the power supply system exceeding a predetermined threshold sink current.

19. The method of claim 16, wherein the power supply system is configured for use in a bipolar system, and generating the output voltage further includes:

generating a third output responsive to the input signal using a first sink driver powered by a third supply rail voltage; and
generating a fourth output responsive to the input signal using a second sink driver powered by a fourth supply rail voltage, and wherein:
the first and second supply rail voltages are positive voltages and the third and fourth supply rail voltages are negative voltages;
the first sink driver or the second sink driver is enabled via a third enable signal or a fourth enable signal, respectively, and
the first sink driver or the second sink driver is disabled via a third disable signal or a fourth disable signal, respectively.

20. The method of claim 16, wherein in each of the first source driver and the second source driver, when enabled, an output current larger than normal output current corresponding to the input signal is generated, until the output current exceeds a predetermined threshold output current.

21. In a power supply system, a method of generating an output voltage, the method comprising:
receiving an input signal at an input node; and
generating the output voltage at an output node for driving a load using one or more of a plurality of output drivers whose inputs are coupled to the input node and outputs are coupled to the output node, each of the output drivers being powered by different supply rail voltages,
wherein said one or more of the output drivers are enabled via the associated enable control signal depending upon the output voltage at the output node, and
wherein a frequency of switching of enabling between the output drivers is limited to be less than a predetermined threshold.

22. The method of claim 21, wherein generating an output voltage includes:
generating a first output responsive to the input signal using a first source driver powered by a first supply rail voltage;
generating a second output responsive to the input signal using a second source driver powered by a second supply rail voltage;
enabling the first source driver via a first enable signal responsive to the output voltage of the power supply system being lower than the first supply rail voltage;
enabling the second source driver via a second enable signal responsive to the output voltage being higher than the first supply rail voltage;
determining an amount of time passed since the second source driver became enabled;
prohibiting enabling of the first source driver until said amount of time exceeds a predetermined time limit; and
providing the output voltage based on the first output or the second output responsive to whether the first source driver or the second source driver, respectively, is enabled.

23. The method of claim 21, wherein generating an output voltage includes:
generating a first output responsive to the input signal using a first source driver powered by a first supply rail voltage;
generating a second output responsive to the input signal using a second source driver powered by a second supply rail voltage;
enabling the first source driver via a first enable signal responsive to the output voltage of the power supply system being lower than the first supply rail voltage;

enabling the second source driver via a second enable signal responsive to the output voltage being higher than the first supply rail voltage;

adjusting the first supply rail voltage such that the frequency of switching of enabling between the first and second source drivers is less than the predetermined threshold; and providing the output voltage based on the first output or the second output responsive to whether the first source driver or the second source driver, respectively, is enabled.

24. The method of claim 23, wherein the first supply rail voltage is adjusted responsive to an amplitude of the input signal at the input node or the output voltage at the output node.

25. The method of claim 23, wherein the adjustable first supply rail voltage is generated as a step-down voltage of the second supply rail voltage.

26. A power supply system, comprising:
an input node for receiving an input signal;
an output node for driving a load;
a plurality of output drivers whose inputs are coupled to the input node and outputs are coupled to the output node, each of the output drivers being powered by different supply rail voltages and configured to be enabled by an associated enable control signal;
a controller configured to enable one or more of the output drivers via the associated enable control signal depending upon an output voltage level at the output node, and
an adjustable power supply providing one or more of the supply rail voltages, the controller further configured to adjust said one or more of the supply rail voltages responsive to at least one of the input signal at the input node or the output voltage level at the output node.

27. In a power supply system, a method of generating an output voltage, the method comprising:
receiving an input signal at an input node; and
generating the output voltage at an output node for driving a load using one or more of a plurality of output drivers whose inputs are coupled to the input node and outputs are coupled to the output node, each of the output drivers being powered by different supply rail voltages, said one or more of the output drivers being enabled via the associated enable control signal depending upon the output voltage at the output node; and
adjusting one or more of the supply rail voltages responsive to at least one of the input signal at the input node or the output voltage at the output node.

* * * * *